(12) United States Patent
Hayashi et al.

(10) Patent No.: US 7,495,452 B2
(45) Date of Patent: Feb. 24, 2009

(54) WIRE HARNESS CHECKER AND WIRE HARNESS CHECKING METHOD

(75) Inventors: Mishio Hayashi, Saitama (JP); Shuji Yamaoka, Fukuyama (JP); Akira Nurioka, Fukuyama (JP); Yoshikazu Taniguchi, Yokkaichi (JP); Hideo Onishi, Yokkaichi (JP)

(73) Assignees: Sumitomo Wiring Systems, Ltd., Mie (JP); OHT Inc., Hiroshima (JP)

( * ) Notice: Subject to any disclaimer, the term of this patent is extended or adjusted under 35 U.S.C. 154(b) by 0 days.

(21) Appl. No.: 10/558,683

(22) PCT Filed: Jun. 1, 2004

(86) PCT No.: PCT/JP2004/007890

§ 371 (c)(1),
(2), (4) Date: Dec. 20, 2006

(87) PCT Pub. No.: WO2004/106952

PCT Pub. Date: Dec. 9, 2004

(65) Prior Publication Data

US 2007/0184686 A1    Aug. 9, 2007

(30) Foreign Application Priority Data

Jun. 2, 2003    (JP)    ............... 2003-157394

(51) Int. Cl.
*G01R 31/04*    (2006.01)
(52) U.S. Cl. .................. 324/538; 324/539; 702/150
(58) Field of Classification Search .................. 324/538
See application file for complete search history.

(56) References Cited

U.S. PATENT DOCUMENTS

| 5,231,357 | A | * | 7/1993 | Moody et al. ............... 324/539 |
| 6,933,730 | B2 | * | 8/2005 | Parker et al. ............... 324/538 |
| 2007/0073512 | A1 | * | 3/2007 | Yamaoka et al. ............ 702/150 |

FOREIGN PATENT DOCUMENTS

| JP | 6-230140 | 8/1994 |
| JP | 8-138462 | 5/1996 |
| JP | 11-108982 | 4/1999 |

* cited by examiner

*Primary Examiner*—Timothy J Dole
*Assistant Examiner*—Benjamin M Baldridge
(74) *Attorney, Agent, or Firm*—Westerman, Hattori, Daniels & Adrian, LLP.

(57) ABSTRACT

Disclosed is a wire harness checker and a wire harness checking method, which are capable of determining whether a terminal of a terminal-fitted wire is adequately inserted in a connector housing, without contact with the wire and the terminal, objectively and reliably. Each of three pairs of sensor plates (20a, 20b; 30a, 30b; 40a, 40b) are disposed adjacent to an outer wall surface of a connector housing 10 in opposed relation to one another. An AC inspection signal is supplied to a terminal to be inserted into the connector housing 10, and detected from the terminal by each of the pairs of sensor plates (20a, 20b), (30a, 30b), (40a, 40b), to detect an insertion position of the terminal in the connector, in accordance with a relative value of each detection signal from the sensor plates, so as to determine adequacy of the insertion position.

5 Claims, 8 Drawing Sheets

| Cavity Location | Vx1 (Vp-p) | Vx2 (Vp-p) | Calculated Voltage (Vp-p) |
|---|---|---|---|
| 20 V p−p | | | |
| (1, 2) | 7.29 | 0.38 | 0.41 |
| (2, 2) | 2.05 | 0.56 | 1.56 |
| (3, 2) | 1.06 | 0.83 | 3.05 |
| (4, 2) | 0.62 | 1.37 | 4.77 |
| (5, 2) | 0.42 | 2.67 | 5.93 |
| (6, 2) | 0.29 | 9.28 | 6.72 |
| (1, 1) | 6.73 | 0.43 | 0.49 |
| (2, 1) | 1.72 | 0.62 | 1.83 |
| (3, 1) | 0.94 | 0.84 | 3.30 |
| (4, 1) | 0.63 | 1.27 | 4.63 |
| (5, 1) | 0.47 | 2.38 | 5.70 |
| (6, 1) | 0.32 | 8.85 | 6.65 |
| 10 Vp−p | | | |
| (1, 2) | 3.56 | 0.21 | 0.46 |
| (2, 2) | 0.99 | 0.29 | 1.59 |
| (3, 2) | 0.51 | 0.41 | 3.02 |
| (4, 2) | 0.30 | 0.67 | 4.57 |
| (5, 2) | 0.22 | 1.31 | 5.79 |
| (6, 2) | 0.16 | 4.58 | 6.62 |
| (1, 1) | 3.15 | 0.24 | 0.56 |
| (2, 1) | 0.86 | 0.33 | 1.89 |
| (3, 1) | 0.46 | 0.42 | 3.21 |
| (4, 1) | 0.31 | 0.62 | 4.41 |
| (5, 1) | 0.25 | 1.16 | 5.57 |
| (6, 1) | 0.19 | 4.47 | 6.57 |

| (1, 2) | (2, 2) | (3, 2) | (4, 2) | (5, 2) | (6, 2) |
|---|---|---|---|---|---|
| (1, 1) | (2, 1) | (3, 1) | (4, 1) | (5, 1) | (6, 1) |

Cavity location in connector housing

Cavities in connector housing arranged at even intervals (pitch: about 2.5 mm)

Table 2

|              | 20 Vp-p  | 10 Vp-p  |
|--------------|----------|----------|
| Upper Portion | column 1 | column 3 |
| Lower Portion | column 2 | column 4 |

Fig. 7B

WIRE HARNESS CHECKER AND WIRE HARNESS CHECKING METHOD

TECHNICAL FIELD

The present invention relates to a wire harness checker and a wire harness checking method for inspecting, in a non-contact manner, whether a terminal-fitted wire comprising an electric wire and a terminal fixedly fitted onto an end of the wire is adequately inserted in a connector housing.

BACKGROUND ART

Late years, an electric control-based operation system has been increasingly used in various products. In such a system, a wire harness has a key role in connecting a controller to various electric components, and defects in a wire harness have a direct impact on total quality of a product.

Thus, in a wire harness production process, it is required to inspect a production quality of a wire harness. Specifically, a wire harness has heretofore been inspected in such a manner that a connector housing attached with a plurality of terminals of a wire harness (or an assembly of terminal-fitted wires) is mounted on an inspection jig, and then an inspection probe is brought into mechanical contact with each of the terminals to perform continuity check.

For example, Japanese Patent Laid-Open Publication No. 08-146070 discloses an inspection apparatus, wherein, in an inspection mode, an output-side inspection connector for receiving an inspection signal is mechanically connected to an output-side connector (or connector housing) fitted with one end of a terminal-fitted wire assembly having the other end inserted in an input-side connector pre-connected to an input-side inspection connector for supplying the inspection signal, and then the inspection signal is applied from the input-side inspection connector to each terminal of the terminal-fitted wire assembly inserted in the input-side connector so as to inspect a production quality of the wire harness (unit of the input-side and output-side connectors and the terminal-fitted wire assembly).

However, the continuity check based on mechanical contact using the inspection probe involves a problem about occurrence of plastic deformation in the terminal due to defects in the inspection probe.

In recent trend, the size of a terminal has become smaller and smaller along with downsizing of connectors, it becomes difficult to ensure an end-surface area of a terminal, which is required for adequate contact with an inspection probe. Thus, some inspections have to be performed by bringing an inspection probe into contact with a tongue portion of a terminal to ensure a sufficient contact surface. In this case, even slight change in contact force of the inspection probe is likely to cause plastic deformation in the terminal tongue.

Moreover, if a positive result is obtained in the continuity check, the wire harness will be determined to be normal regardless of occurrence of the plastic deformation, and this defect will undesirably come up to the surface after the wire harness is incorporated in a product. Thus, there is a strong need for providing a wire harness checker capable of inspecting a wire harness without contact between a terminal and an inspection probe.

Further, an inspection operation about faulty-wiring has heretofore been performed after completion of an operation for inserting a plurality of terminals of a terminal-fitted wire assembly into a connector. Thus, if a faulty-wiring is detected, it is necessary to perform a significantly time-consuming operation for detaching and re-inserting the terminal of the relevant terminal-fitted wire.

DISCLOSURE OF THE INVENTION

In view of the above problems, it is therefore an object of the present invention to provide a wire harness checker and a wire harness checking method capable of inspecting a wire harness without damage in connector housings and terminals, and usable even during a wire harness production process.

In order to achieve the above object, according to a first aspect of the present invention, there is provided a wire harness checker for inspecting a state when and after a terminal of a terminal-fitted wire having an end fixedly fitted with the terminal is inserted into a connector housing to form a wire harness. The wire harness checker comprises: AC inspection signal supply means for supplying an AC inspection signal to the terminal-fitted wire at least when the terminal thereof is inserted in the connector housing; at least one pair of electrically-conductive plates disposed adjacent to the connector housing and adapted to detect the AC inspection signal from the terminal of the terminal-fitted wire inserted into the connector housing; and determination means for determining a position where the terminal of the terminal-fitted wire supplied with the AC detection signal from the AC inspection signal supply means is inserted in the connector housing, in accordance with a relative detection value of each detection signal of the pair of electrically-conductive plates.

In the above wire harness checker, the determination means may be operable to convert each detection signal of the pair of electrically-conductive plates into the relative detection value, on the basis of a distance between the electrically-conductive plates, so as to cancel a variation in the AC inspection signal supplied to the terminal-fitted wire.

According to a second aspect of the present invention, there is provided a wire harness checking method for use in a wire harness checker which includes: a plurality of wire support members each adapted to support, with respect to each of a plurality of insertion locations of the connector housing, a corresponding one of a plurality of terminal-fitted wires to be sequentially attached to a connector housing, and provided with a signal supply portion adapted to achieve capacitive coupling for each of the terminal-fitted wires; inspection signal feeding means for feeding an AC inspection signal to one of the wire support members which supports one of the terminal-fitted wires to be attached to the connector housing, so as to supply the AC inspection signal to the terminal-fitted wire; and at least one pair of electrically-conductive plates disposed adjacent to an outer surface of the connector housing in opposed relation to one another. The wire harness checking method comprises: detecting each of the AC inspection signals from the electrically-conductive plates; determining a location where one of the terminal-fitted wires is attached to the connector housing, in accordance with a relative detection value of each of the detected AC inspection signals; and allowing checking on whether one of the terminal-fitted wires which is supplied with the AC inspection signals corresponds to the determined location of the attached terminal-fitted wire.

According to a third aspect of the present invention, there is provided an apparatus for inspecting a position where a terminal supplied with an AC inspection signal is inserted in a connector housing. The apparatus comprises: at least one pair of electrically-conductive plates disposed adjacent to an outer surface of the connector housing in opposed relation to one another and adapted to detect the AC inspection signal from the terminal inserted into the connector housing; and determination means for determining an insertion position of the terminal in the connector housing, in accordance with an AC-inspection-signal detection result from each of the electrically-conductive plates. The determination means is operable to determine an insertion position of the terminal in the connector housing, in accordance with a relative detection value of each detection signal of the pair of electrically-conductive plates, so as to inspect the insertion position of the terminal in the connector housing.

In the above apparatus, given that the pair of electrically-conductive plates are defined, respectively, as n1 and n2, the determination means is operable to determine an insertion position of the terminal in the connector housing by comparing between a value obtained from the following formula: (Vn2)/(Vn1+Vn2), wherein Vn1 and Vn2 are, respectively, signal values detected from the terminal by the pair of electrically-conductive plates, and a reference value obtained from the following formula: (Vn2)/(Vn1+Vn2), wherein Vn1 and Vn2 are, respectively, signal values detected by the pair of electrically-conductive plates when disposed at a predetermined reference position, so as to inspect the insertion position of the terminal in the connector housing.

BEST MODE FOR CARRYING OUT THE INVENTION

With reference to the drawings, one embodiment of the present invention will now be described.

A wire harness checker according to this embodiment is designed to determine whether each of a plurality of terminal-fitted wires is inserted in a connector housing in a proper position, without contact with a terminal of the terminal-fitted wire inserted in the connector housing. This checker makes it possible to perform the positional determination while inserting the terminal-fitted wires into the connector during a wire harness production process, and eliminate the need for checking a positional state of the terminals in the connector in a subsequent production process or a factory shipment stage.

First Embodiment

Figure 1:
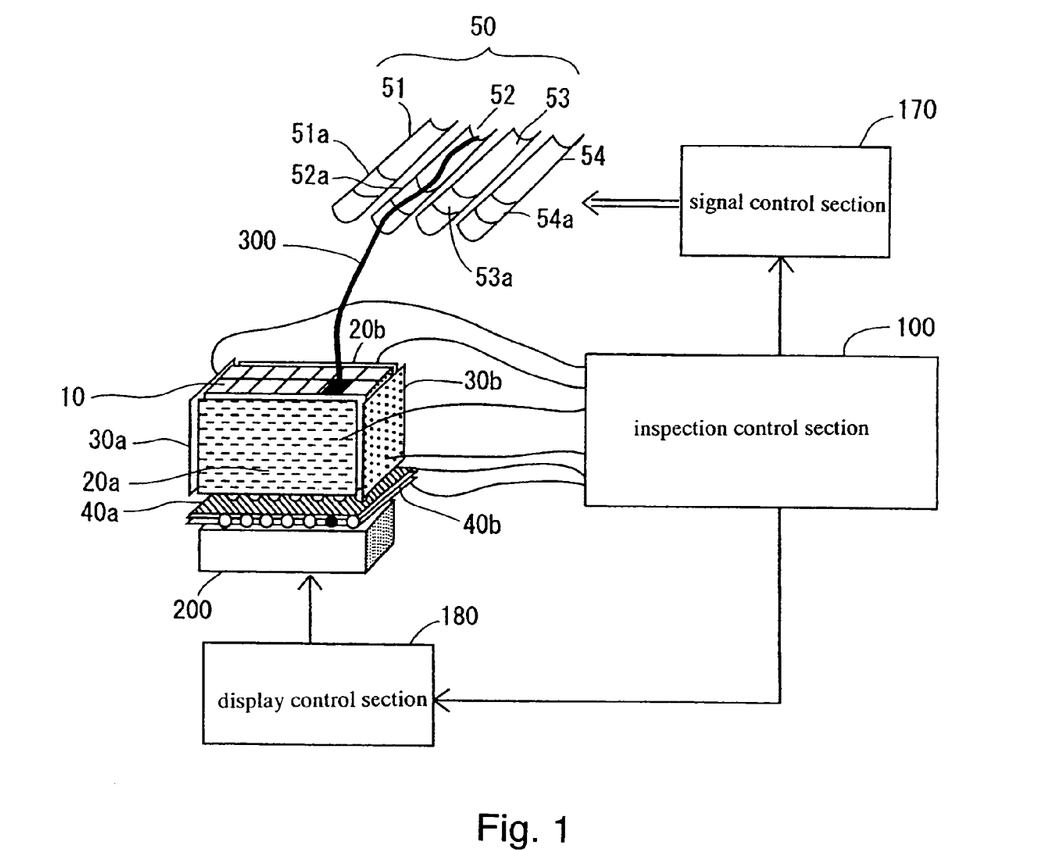
FIG. 1 is an explanatory schematic diagram of a fundamental inspection principle in a wire harness checker according to one embodiment of the present invention.

With reference to FIG. 1, a fundamental inspection principle in the wire harness checker according to this embodiment. FIG. 1 is a schematic diagram showing the wire harness checker according to this embodiment.

In FIG. 1, the reference numeral 10 indicates a connector housing (hereinafter referred to as "connector") serving as an end of a wire harness as an inspection target. One of opposite end terminals of a pre-specified terminal-fitted wire 300 is inserted into a predetermined location of the connector 10 up to a predetermined depth.

For example, this terminal-fitted wire 300 to be attached to the connector 10 is prepared by cutting an electric wire into a predetermined length, and fixedly fitting (e.g. crimping) a pre-specified terminal to be inserted the connector 10, onto each of the ends thereof.

The reference numerals 20a, 20b indicate a pair of Y-axis sensor plates each disposed adjacent to a corresponding one of outer surfaces of a first pair of opposed side walls (e.g. opposite longitudinal side walls when the connector 10 has a rectangular shape in top plan view) of the connector 10. The reference numerals 30a, 30b indicate a pair of X-axis sensor plates each disposed adjacent to a corresponding one of outer surfaces of a second pair of opposed side walls (e.g. opposite narrower side walls when the connector 10 has a rectangular shape in top plan view) of the connector 10.

The reference numerals 40a, 40b indicate a pair of Z-axis sensor plates which are disposed adjacent to a connection surface (bottom surface in FIG. 1) of the connector 10 relative to another connector to be mated to the connector 10, and spaced apart from one another by a given distance in a parallel arrangement. While the Z-axis sensor plates 40a, 40b illustrated in FIG. 1 are formed, respectively, on opposite surfaces of an insulating sheet to ensure the given distance therebetween, the present invention is not limited to this manner.

The reference numeral 50 indicates a wire support unit for supporting the terminal-fitted wire to be attached to the connector 10. In the embodiment illustrated in FIG. 1, the support member 50 includes four watershoot-shaped support members 51 to 54 each designed to support one terminal-fitted wire independently.

Each of the watershoot-shaped support members 51 to 54 is partly formed as or provided with a signal supply portion 51a (52a, 53a, 54a) for receiving an AC inspection signal and supply the received AC inspection signal to the wire supported thereon.

In this embodiment, each of the watershoot-shaped support members 51 to 54 is located at a position where even after a selected one of the terminal-fitted wires supported by the watershoot-shaped support member (52a in FIG. 1) is pulled outward to insert the terminal of this terminal-fitted wire into the connector 10), at least a portion of the selected terminal-fitted wire is located at a position opposed to the corresponding signal supply portion (52a in FIG. 1).

Thus, during the course of an operation for inserting the terminal of the selected terminal-fitted wire into a given position (location and depth) of the connector 10, at least portion of the selected terminal-fitted wire is always located at a position opposed to the corresponding signal supply portion, and constantly supplied with an AC inspection signal as long as the corresponding signal supply portion is in a signal receiving state.

Preferably, an AC inspection signal is supplied only to either one of the terminal-fitted wires supported by one of the watershoot-shaped support members 50 which is receiving the AC inspection signal, but not to the terminal-fitted wires supported by the remaining watershoot-shaped support members 50. For this purpose, it is preferable to provide a shield in each outer portion of the watershoot-shaped support members 50 so as to electromagnetically shield between the adjacent the watershoot-shaped support members 50 to reduce the level of outside leakage of an AC inspection signal supplied from one of the signal supply portions to the corresponding terminal-fitted wire.

Figure 2:
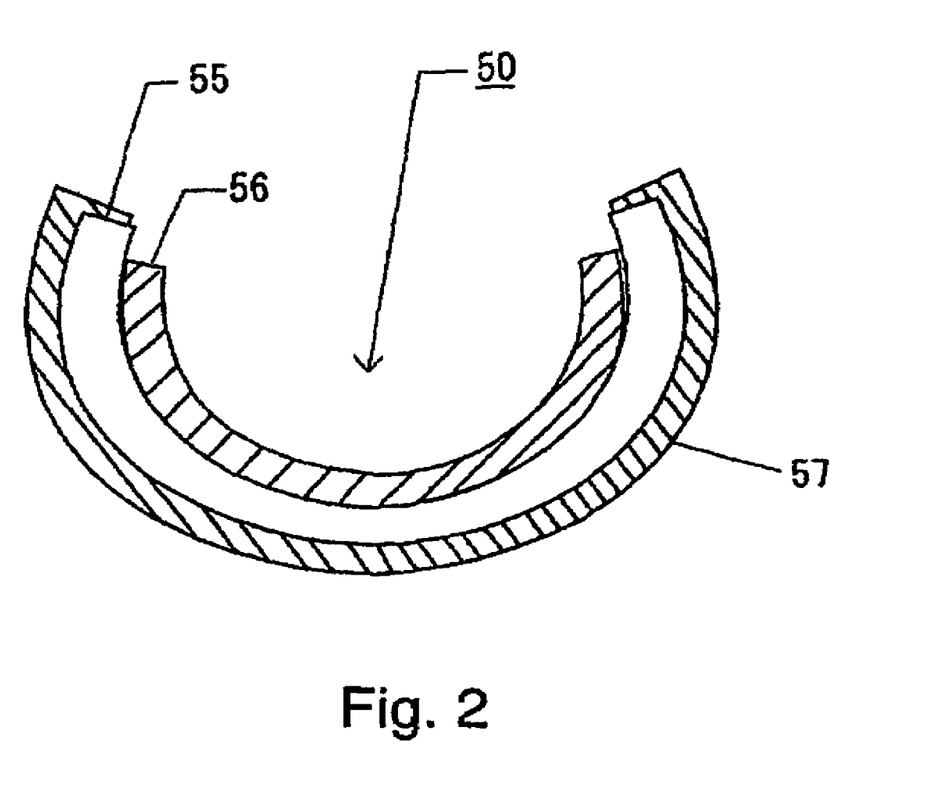
FIG. 2 is a schematic diagram showing the structure of a watershoot-shaped support member 50 having an electromagnetically shielded outer portion, in the wire harness checker in FIG. 1.

FIG. 2 shows a detailed structure of the watershoot-shaped support member 50 having an outer portion which is electromagnetically shielded as described above.

In FIG. 2, the reference numeral 55 indicates a signal supply portion made of an electrically conductive material. When no AC signal (inspection signal) is fed thereto, the signal supply portion 55 has an electromagnetically shielding function. Specifically, when it is required to serve as signal supply means, the AC signal is fed from an after-mentioned signal feeding control section 170. If it is required to serves as electromagnetically shielding means (if it is not necessary to serve as the signal supply means), the signal supply portion 55 is grounded. This structure makes it possible to supply the AC signal, in a non-contact manner, to the terminal-fitted wire supported by the watershoot-shaped portion 55, and provide a low power-to-ground impedance in the terminal-fitted wire when no AC signal is fed thereto.

The reference numeral 56 indicates a wire-harness protecting member for preventing damages in the terminal of the wire harness due to contact between the terminal and a metal element associated with the signal supply portion. For example, the wire-harness protecting member 56 is made of plastic.

The reference numeral 57 indicates a support member made, for example, of plastic. The support member 57 is formed to support a terminal-fitted wire and the signal supply portion 55, and serve at least as an outer wall extending over a surface area of the signal supply portion 55.

While the watershoot-shaped support member in FIG. 2 has a semicircular shape, the present invention is not limited to this embodiment. For example, the support member may have any other suitable shape, such as a cylindrical shape designed to allow the terminal-fitted wire to be inserted therethrough.

The signal supply portion 55 may be formed by attaching to the watershoot-shaped support member an aluminum foil having excellent electric conductive characteristics and relatively low cost. When the watershoot-shaped support members are designed to provide a sufficient distance between the adjacent terminal-fitted wires, and made of non-electrically conductive material, such as plastic, the aluminum foil may be attached onto an outer surface of the watershoot-shaped support members to form the signal supply portion.

While the wire harness checker according to the embodiment illustrated in FIG. 1 has only four of the watershoot-shaped support members, the number of the watershoot-shaped support members may be practically set at a value corresponding to the number of terminal-fitted wires to be attached to at least ten of the connectors 10.

In FIG. 1, as mentioned above, the sensor plates (20a, 20b, 30a, 30b, 40a, 40b) are positioned adjacent to the side surfaces and the bottom surface of the connector 10. Thus, when the terminal of a selected one of the terminal-fitted wire supplied with an AC inspection signal is inserted into the connector 10, the signal from this terminal is detected by the sensor plates (20a, 20b, 30a, 30b, 40a, 40b), to obtain a detection signal. Specifically, this detection signal is detected as a level corresponding to a distance from this terminal The reference numeral 100 indicates an inspection control section for controlling various operations of the wire harness checker, and the reference numeral 170 indicates a signal feeding control section for controllably feeding an AC inspection signal to each of the signal supply portion (51a, 51a, 53a, 54a) of the support unit 50, under the control of the inspection control section 100.

The signal feeding control section 170 is operable to feed an AC inspection signal sequentially to the signal supply portions of the watershoot-shaped support members. More specifically, the signal feeding control section 170 is operable, at a certain timing, to feed the AC inspection signal only either one of the terminal-fitted wires supported by the watershoot-shaped support members 50 without simultaneously feeding the AC inspection signal to the remaining terminal-fitted wires.

An AC inspection signal to be fed from the signal feeding control section 170 is not limited to a specific waveform. Preferably, the AC inspection signal is a sine wave having a frequency of 1 KHz to 10 KHz to simplify the structure of an oscillator. A desirable level of the AC inspection signal is varied depending on an effective signal-supply area of each of the signal supply portions. For example, when the signal supply portion is formed to have a length, for example, of about 50 cm in a longitudinal direction of each of the watershoot-shaped support members (or a longitudinal direction of each of the terminal-fitted wires), a desirable inspection can be achieved by setting a signal level of 25 Vp-p. This means that, even if an operator touches the signal supply portion, the signal level has no adverse affect on the body of the operator. This allows the operator to safely perform the inspection.

Preferably, during a period where no AC inspection signal is fed to the signal supply portion, this signal supply portion is grounded. When the signal supply portion is in a grounded state, a leakage signal level to the terminal-fitted wire supported by the corresponding watershoot-shaped support member can be lowered, and thereby an error due to adverse affects of the leakage signal to this terminal-fitted wire can be reduced.

The reference numeral 180 indicates a display control section for controlling a plurality of light-emitting elements in an insertion-location designation unit 200 in such a manner as to activate one of the light-emitting elements disposed at a position corresponding to a location of the connector housing into which the terminal of a selected one of the terminal-fitted wires is to be inserted next, under the control of the inspection control section 100.

In this embodiment, the inspection control section 100 is designed such that, in each pair of sensor plates (20a, 20b; 30a, 30b; 40a, 40b), a distance between the pair of sensor plates is calculated based on two detection signal values obtained by the pair of sensor plates, and then a relative distance between the inserted terminal and each of the pair of sensor plates is detected based on each of the two detection signal values while using the calculated distance between the pair of sensor plates as a reference value. This makes it possible to reduce variations due to a difference in level of an AC inspection signal to be supplied from the signal supply portion to a corresponding terminal-fitted wire An insertion location of the terminal supplied with an AC inspection signal, in the connector 10, can be clarified by detecting a Y-axis directional (lateral) position in the connector 10 using the Y-axis sensor plates 20a, 20b, and detecting an X-axis directional (longitudinal) position in the connector 10 using the X-axis sensor plates 30a, 30b, and then can be detected whether the terminal is inserted in a proper location.

Further, on the basis of the given distance between the two Z-axis sensor plates 40a, 40b which are positioned adjacent to the bottom surface of the connector 10, a relative distance between the inserted terminal and each of the sensor plates. This makes it possible to determine whether the terminal is inserted in a given position or depth in the connector 10 (whether the terminal of a selected one of the terminal-fitted wires is adequately inserted in the connector 10).

In this embodiment, each of the sensor plates (20a, 20b, 30a, 30b, 40a, 40b) is operable to detect the AC inspection signal from the inserted terminal, and each detection voltage of the sensor plates is dependent on a surface area of the sensor plate opposed to the terminal. Thus, even if the sensor plate is partly formed with a hole or a cutout portion, a variation in detection results is significantly small, and substantially ignorable.

For example, the aforementioned plurality of light-emitting elements of the insertion-location designation unit 200 is positioned under the bottom surface of the connector 10, correspondingly to a plurality of insertion locations of the connector 10, for example, in a matrix arrangement. Further, a plurality of holes each having a given diameter may be formed in portions of the Z-axis sensor plates 40a, 40b located, respectively, above the light-emitting elements, without any problem. Thus, based on the display control section 180, one of the light-emitting elements located under a location into which one of the terminals is to be inserted next can be activated to emit light so as to visually indicate a terminal-insertion location to an operator responsible for the operation for inserting the next terminal into the connector 10. Alternatively, the wire harness checker according to the above embodiment is designed to activate one of the light-emitting elements located a lower portion of a location into which one of the terminals is to be inserted.

In this case, light emitted from the light-emitting element located at the lower portion of the terminal-insertion location can provide enhanced visibility. Further, when the terminal is inserted into the proper position, the light emitted from the light-emitting element will be blocked by the terminal. Thus, based on the fact that the light emitted from the light-emitting element is blocked, an operator can determine that the terminal is inserted in the proper location, unmistakably, readily and reliably.

Figure 3:
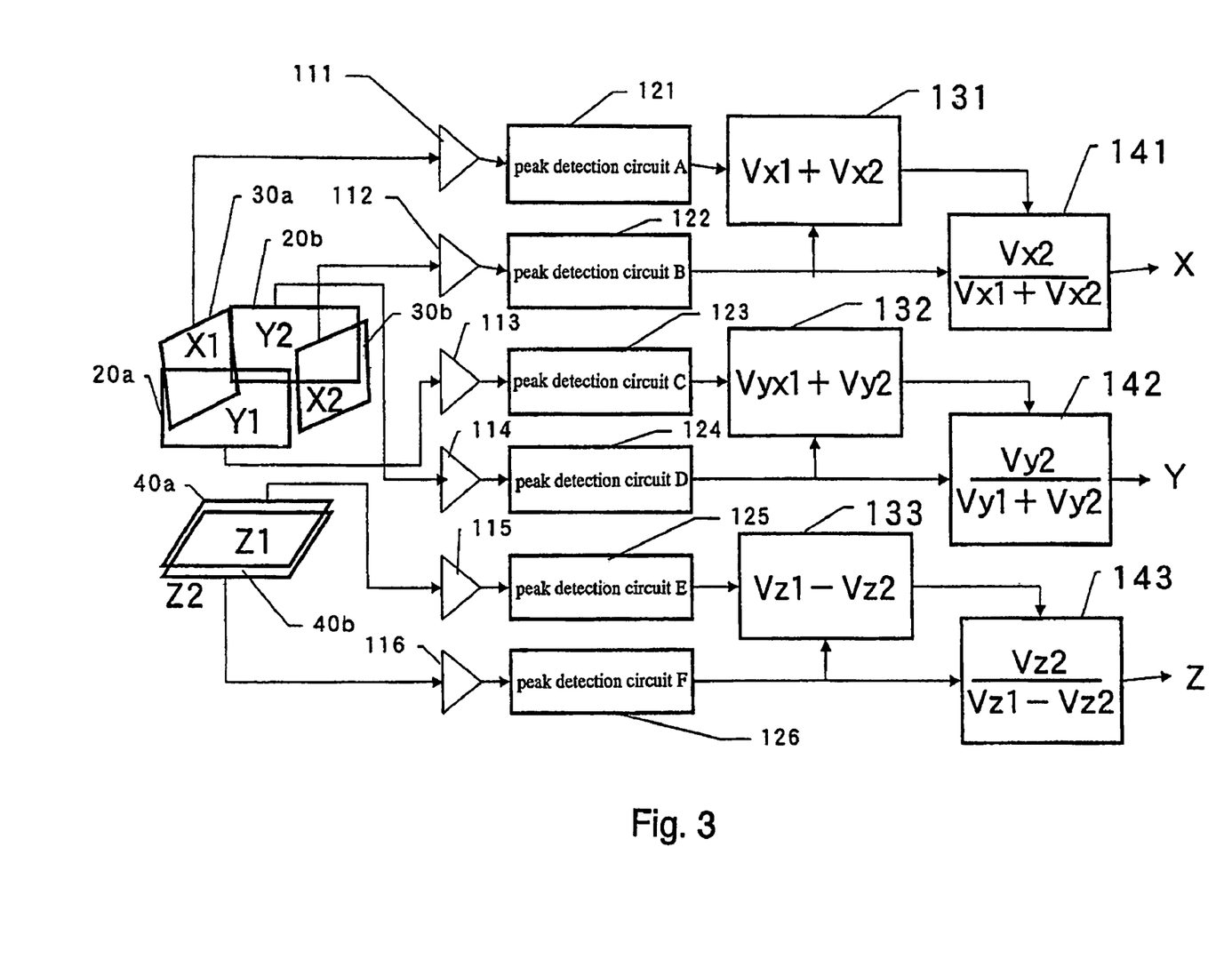
FIG. 3 is a block diagram showing a detailed configuration of an inspection signal processor of an inspection control section in the wire harness checker according to the embodiment.

With reference to FIG. 3, a detailed configuration of an inspection signal processor of the inspection control section 100 will be described. FIG. 3 is a block diagram showing the inspection signal processor.

In FIG. 3, the reference numerals 111 to 116 indicate amplifiers each operable to amplify a detection signal from a corresponding one of the sensor plates (20a, 20b, 30a, 30b, 40a, 40b), and the reference numerals 121 to 126 indicate peak detection circuit A to F each operable to detect a peak value of the detection signal from a corresponding one of the sensor plates (20a, 20b, 30a, 30b, 40a, 40b).

The reference numerals 131 indicates an X-axis adder circuit operable, in response to receiving from the peak detection circuits A121, B122 respective peak value signals ($V_{x1}$, $V_{x2}$) of the detection signals of the X-axis sensor plates 30a, 30b, to add the received peak values so as to obtain an X-axis addition value ($V_{x1}+V_{x2}$). The reference numerals 132 indicates a Y-axis adder circuit operable, in response to receiving from the peak detection circuits C123, D124 respective peak value signals ($V_{y1}$, $V_{y2}$) of the detection signals of the Y-axis sensor plates 20a, 20b, to add the received peak values so as to obtain a Y-axis addition value ($V_{y1}+V_{y2}$). The reference numerals 133 indicates a Z-axis subtracter circuit operable, in response to receiving from the peak detection circuits E125, F126 respective peak value signals ($V_{z1}$, $V_{z2}$) of the detection signals of the Z-axis sensor plates 40a, 40b, to calculate and output a difference ($V_{z1}-V_{z2}$) between the received peak values.

The reference numeral 141 indicates an X-axis divider circuit operable, in response to receiving an output from the X-axis adder circuit 131 and the peak value signal from either one of the peak detection circuits A121, B 122 (e.g. the peak value signal of the detection value of the X-axis sensor plate 30b), to divide the received peak value signal (e.g. the peak value signal of the detection value of the X-axis sensor plate 30b) by the received X-axis addition value ($V_{x1}+V_{x2}$) so as to obtain a value $\{V_{x2}/(V_{x1}+V_{x2})\}$.

An output of the X-axis divider circuit 141 represents a relative change in either one of the detection signals from the X-axis sensor plates 30a, 30b. This makes it possible to cancel an influence of changes in intensity of an AC inspection signal applied (supplied) from the signal supply portion to the corresponding terminal-fitted wire, if any. Thus, the output of the X-axis divider circuit 141 has a signal level corresponding directly to an X-axis directional position of the terminal of the terminal-fitted wire in the connector 10. That is, an X-axis directional position of the terminal of the terminal-fitted wire inserted in the connector 10 can be detected according to the output of the X-axis divider circuit 141 in a non-contact manner.

The reference numeral 142 indicates a Y-axis divider circuit operable, in response to receiving an output from the Y-axis adder circuit 132 and the peak value signal from either one of the peak detection circuits C123, D124 (e.g. the peak value signal of the detection value of the Y-axis sensor plate 20b), to divide the received peak value signal (e.g. the peak value signal of the detection value of the Y-axis sensor plate 20b) by the received Y-axis addition value ($V_{y1}+V_{y2}$) so as to obtain a value $\{V_{y2}/(V_{y1}+V_{y2})\}$.

An output of the Y-axis divider circuit 142 represents a relative change in either one of the detection signals from the Y-axis sensor plates 20a, 20b. This makes it possible to cancel an influence of changes in intensity of an AC inspection signal applied (supplied) from the signal supply portion to the corresponding terminal-fitted wire, if any. Thus, the output of the Y-axis divider circuit 142 has a signal level corresponding directly to a Y-axis directional position of the terminal of the terminal-fitted wire in the connector 10. That is, a Y-axis directional position of the terminal of the terminal-fitted wire inserted in the connector 10 can be detected according to the output of the Y-axis divider circuit 142 in a non-contact manner.

The reference numeral 143 indicates a Z-axis divider circuit operable to divide the peak value signal (e.g. the peak value signal ($V_{z2}$) of the detection value of the Z-axis sensor plate 40b) by the Z-axis difference ($V_{z1}-V_{z2}$) so as to obtain a value $\{V_{z2}/(V_{z1}-V_{z2})\}$.

An output of the Z-axis divider circuit 143 represents a relative change in either one of the detection signals from the Z-axis sensor plates 40a, 40b. This makes it possible to cancel an influence of changes in intensity of an AC inspection signal applied (supplied) from the signal supply portion to the corresponding terminal-fitted wire, if any. Thus, the output of the Z-axis divider circuit 143 has a signal level corresponding directly to a distance between the inserted terminal of the terminal-fitted wire and either one of the Z-axis sensor plates 40a, 40b. That is, it can be detected whether the terminal is inserted to reach a desired insertion position or depth, according to the output of the Z-axis divider circuit 143 in a non-contact manner.

The above circuit configuration is based on the flowing relationship in the X-axis sensor plates or the Y-axis sensor plates. Given that X and Y is defined by n, $$[1/\{(1/V_{n2})+(1/V_{n1})\}]/V_{n1} = \{(V_{n1} \times V_{n2})/(V_{n1}+V_{n2})\}/V_{n1}$$
$$= (V_{n2})/(V_{n1}+V_{n2})$$

That is, in this embodiment, an AC inspection signal is detected through the use of capacitive coupling, and therefore a level of a detection signal from each of the pair of (electrically conductive) sensor plates has a value inversely proportional to a distance between each of the pair of sensor plates and the terminal of the terminal-fitted wire. Thus, an inverse value $(1/V_{n1})$ or $(1/V_{n2})$ of the signal level corresponds to the distance between each of the pair of sensor plates and the terminal.

Thus, the sum $\{(1/V_{n1})+(1/V_{n2})\}$ of these inverse values is equivalent to a distance (reference distance) between the pair of sensor plates (e.g. 30a, 30b), and the final value $[1/\{(1/V_{n2})+(1/V_{n1})\}]/V_{n1}$ represents a position of $(1/V_{n1})$ relative to the reference distance Further, an inverse value $[1/\{(1/V_{n1})-(1/V_{n2})\}]$ of the final value represents a reference voltage value corresponding to the reference distance. Furthermore, an inverse value $[V_{n1}/\{(1/V_{n1})-(1/V_{n2})\}]$ represents a ratio of($V_{n1}$) to the reference voltage. This can absorb variation in the ratio due to variations in a supplied AC inspection signal. This calculated ratio also represents a value proportional to a distance. Thus, this ratio is optimally usable for the inspection.

As shown in FIG. 1, a distance between the pair of conductive sensor plates arranged perpendicularly to a column or row direction of the connection is used as the reference direction during the operation for measuring a position of the terminal (i.e. a measured value is expressed as a relative value on the basis of the reference distance). This reference distance includes at least a reference distance for the X-axis sensor plates 20a, 20b, and a reference distance for the Y-axis sensor plates 30a, 30b.

For example, if a holder is used for positioning the connector, a tolerance of the reference distance is determined by mechanical accuracy of the holder. In this embodiment, it is possible to achieve a tolerance of about 0.1 mm. Thus, the terminal-position measuring operation can be accurately performed.

During the measurement, a level of a detection signal from each of the pair of conductive sensor plates is varied depending on an insertion location of the terminal in the connection. In this case, for example, during a process of processing detection signals from the opposed conductive sensor plates, respective peak values of the detection signals may be detected under the conditions of the same amplification degree or gain and the same offset value, to obtain $V_1$ and $V_2$ in the form of a DC voltage value. Further, for example, a value $\{V_{x2}/(V_{x1}+V_{x2})\}$ may be calculated through the X-axis divider circuit to obtain a voltage value V1 corresponding to an insertion location of the terminal supplied with an AC inspection signal.

Thus, even if a level of an AC inspection signal applied to the terminal-fitted wire is reduced to half or (½), for some reason, all of the values $V_{x1}$, $V_{x2}$,—are reduced to (½). Thus, there is no adverse affect on the voltage value equivalent to distance.

In this embodiment, before an actual measurement, the aforementioned calculation operation is performed while inserting the terminal applied with an AC inspection signal, into each of a plurality of insertion locations in the connector, and an obtained calculation result is stored as reference values. Then, when a target terminal is inserted into one of the insertion locations during the actual measurement, the insertion location is detected based on comparison with the pre-stored reference values.

While the signal processor for addition, division and others, in this embodiment is composed of a hardware-based calculation circuit, the calculation may be performed on a software basis using a computer and a computer program.

Figure 4:
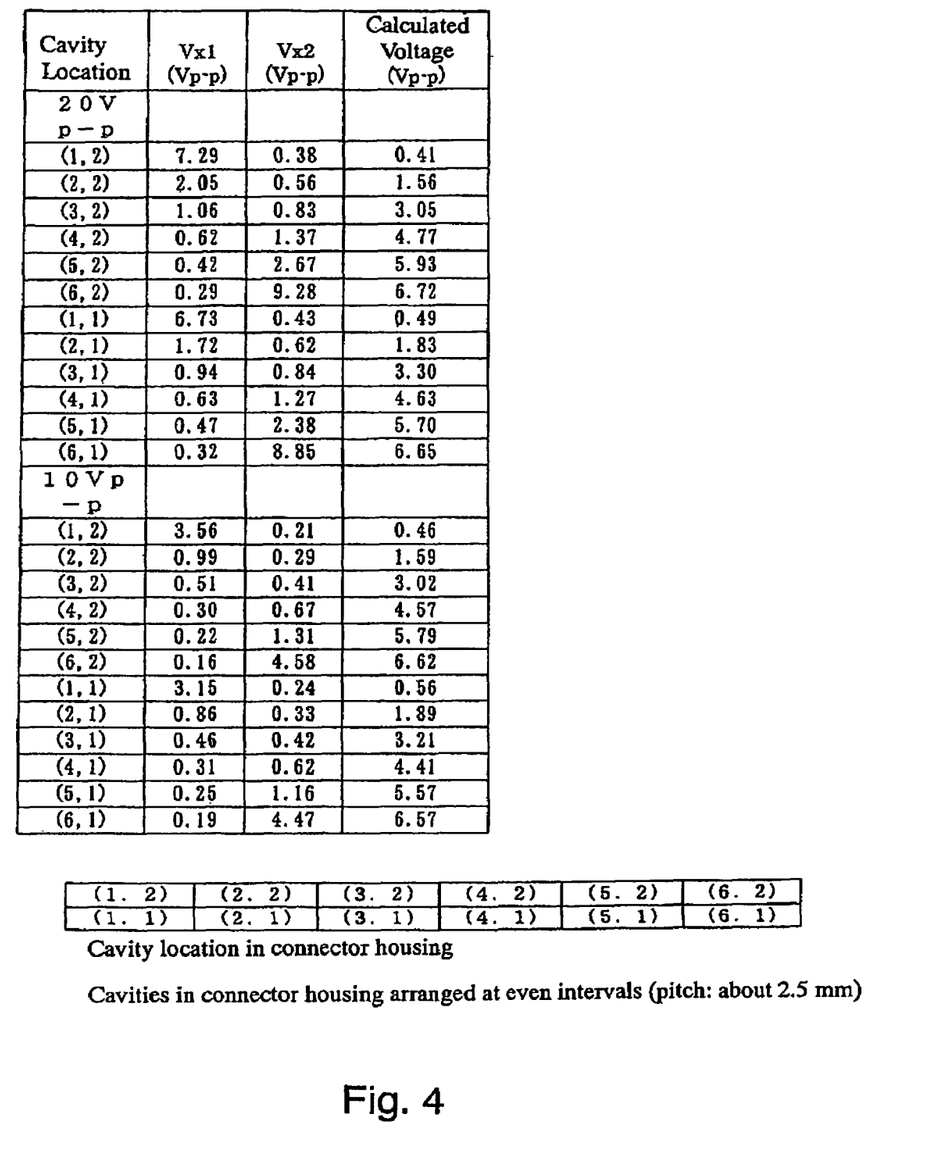
FIG. 4 is a chart showing one example of a detection result using an inspection control section of the wire harness checker according to the embodiment.

FIG. 4 shows one example of an inspection result using the inspection control section in this embodiment.

The example in FIG. 4 was obtained under the conditions that the connector housing is provided with a plurality of terminal retaining portions (cavities) arranged in a lattice pattern as shown in FIG. 1, and a measurement is performed using the hardware-based calculation circuit while inserting a target terminal into the cavities in order from a cavity location (1, 2), wherein the unit of each value is V.

As mentioned above, an AC inspection signal is supplied to the terminal-fitted wires through capacitive coupling. This is likely to cause difficulty in maintaining the inspection signal at a constant level, resulting in large variations. In this connection, FIG. 4 shows two detection results obtained by inserting a terminal of a terminal-fitted wire into each of the cavities of the connector housing while supplying each of AC inspection signals of 20 Vp-p and 10 Vp-p, to the terminal-fitted wire.

In the example illustrated in FIG. 4, the upper column and the lower column show detected inspection signals and voltages after calculation of outputs from the division circuits, respectively, in the detection signal of 20 Vp-p and in the detection signal of 10 Vp-p. As seen in FIG. 4, even when the inspection signal level applied to the terminal-fitted wire is largely varied, a variation in the X1 voltages after calculation of outputs from the division circuits is less than 4%. This makes it possible to obtain a detection result unique to each of the cavity locations.

Cavity Location

Relationship between X voltage after calculation of outputs from dividers

Figure 7A:
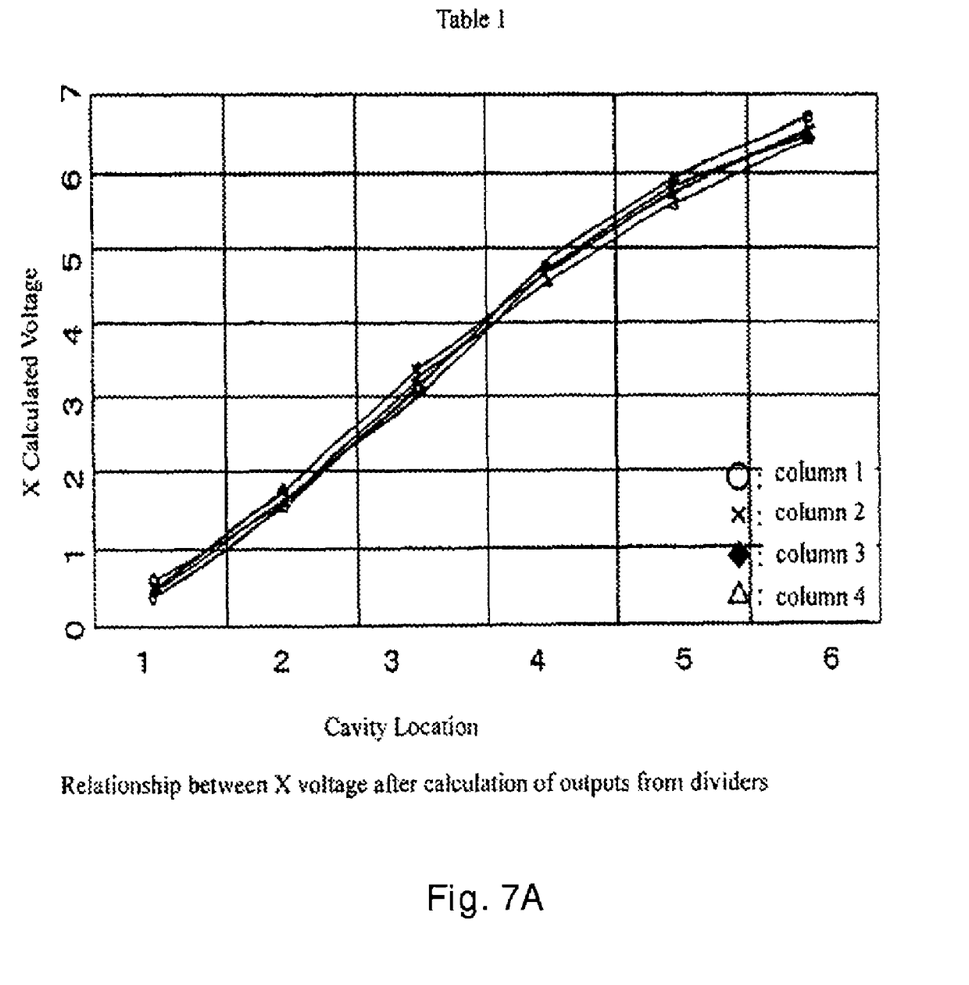
FIG. 7A is a graph showing the relationship between X voltage after calculation of outputs from dividers.
Figure 7B:
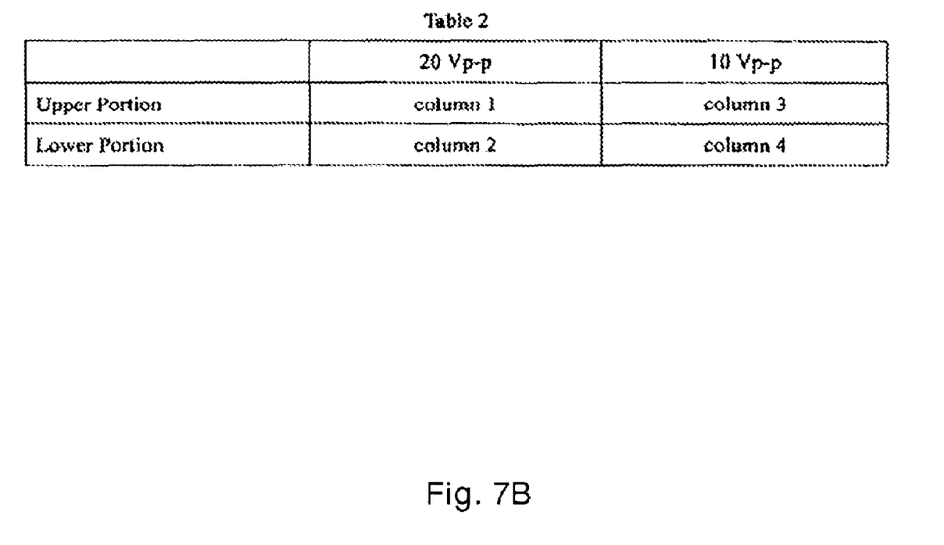
FIG. 7B is a table showing the position of values in FIG. 4.

A relationship between each calculated voltage and each cavity location in FIG. 4 is shown in FIG. 7A and FIG. 7B.

The cavities in the connector housing are arranged at even intervals of about 2.5 mm pitch. Thus, the X calculated value and the cavity location have a proportionality relation, and the X calculated value is not affected and changed by whether the terminal is located in the upper and lower portions of the connector housing, and the supplies voltage. This makes it possible to specify one cavity having the terminal inserted therein according to the X calculated value.

This operation is performed in the Y-axis sensor plates 30a, 30b in the same way. This allows the wire harness checker to provide a stable detection result regardless of variations in the inspection signal supplied to the terminal-fitted wire.

As above, a column-directional cavity location having the inserted terminal can be specified by the X-axis sensor plates 20a, 20b, and a row-directional cavity location having the inserted terminal can be specified by the Y-axis sensor plates 30a, 30b.

In the Z-axis sensors, the following relationship is satisfied:

$$[1/\{(1/V_{z2})-(1/V_{z1})\}]/V_{z1} = \{(V_{z1} \times V_{z2})/(V_{z1}-V_{z2})\}/V_{z1}$$
$$= (V_{z2})/(V_{z1}+V_{z2})$$

While the Z-axis sensor 40b in this embodiment is located on the back side of the Z-axis sensor 40a when viewed from the connector, the detection of an AC inspection signal from the terminal is never blocked by the Z-axis sensor 40a even though a detection value of the Z-axis sensor 40b about the AC inspection signal from the terminal is slightly affected by the Z-axis sensor 40a, because the connector 10 is made of non-electrically conductive material, and therefore each of the Z-axis sensors 40a, 40b is maintained in a high impedance state. Thus, a given level of detection value can be reliably obtained by the Z-axis sensor 40b. That is, a relative relationship between respective detection values of the Z-axis sensor 40a and the Z-axis sensor 40b is determined only by an insertion location of the terminal, and the insertion location of the terminal in the connector 10 can be detected with a certain level of accuracy.

As above, there is no risk the interposition of the Z-axis sensor 40a precludes the Z-axis sensor 40b from detecting an AC inspection signal. Even though a detection signal level of the Z-axis sensor 40b is likely to be lowered due to the interposition of the Z-axis sensor 40a, a certain level of detection value can be reliably obtained.

The above detecting operation can be performed in the same way even when a target terminal is not the first one to be inserted into the connector 10, or when several terminals have already been attached to the connector 10. In this case, even through a detection signal level is varied depending on the locations and number of the attached terminals, it can be accurately detected whether the target terminal is inserted to reach a desired insertion position.

That is, in this embodiment, an AC inspection signal is detected through the use of capacitive coupling, and therefore a level of a detection signal from the pair of electrically conductive sensor plates has a value inversely proportional to a distance between each of the pair of sensor plates and the terminal of the terminal-fitted wire. Thus, an inverse value $(1/V_{z1})$ or $(1/V_{z2})$ of the signal level corresponds to the distance between each of the pair of sensor plates and the terminal.

Thus, the difference $\{((1/V_{z1})-(1/V_{z2})\}$ of these inverse values is equivalent to a distance (reference distance) between the pair of sensor plates 40a, 40b), and the value $[1/\{(1/V_{z2})+(1/V_{z1})\}]/V_{z1}$ is proportional to a position of $(1/V_{z1})$ relative to the reference distance. Further, an inverse value $[1/\{(1/V_{z1})-(1/V_{z2})\}]$ of the above value represents a reference voltage value corresponding to the reference distance.

Furthermore, an inverse value $[V_{z1}/\{(1/V_{z1})-(1/V_{z2})\}]$ represents a ratio of $(V_{z1})$ to the reference voltage. This can absorb variation in the ratio due to variations in a supplied AC inspection signal. This calculated ratio also represents a value proportional to a distance. Thus, this ratio is optimally usable for the inspection.

As above, when a target terminal is inserted, the Z-axis divider circuit 143 can output a detection result unique to an insertion depth of the terminal. Based on this characteristic, the Z-axis sensor plates in this embodiment are used, primarily, for detecting whether the terminal inserting operation is reliably performed.

When the wire harness checker according to this embodiment is used during a wire harness production process, it is necessary to position the connector 10 using a connector holding unit in a production site, and position each of the sensor plates on or adjacent to each of the side and bottom surfaces of the connector. For this purpose, the wire harness checker according to this embodiment comprises a connector holding for holding the connector and positioning the sensor plates.

Figure 6:
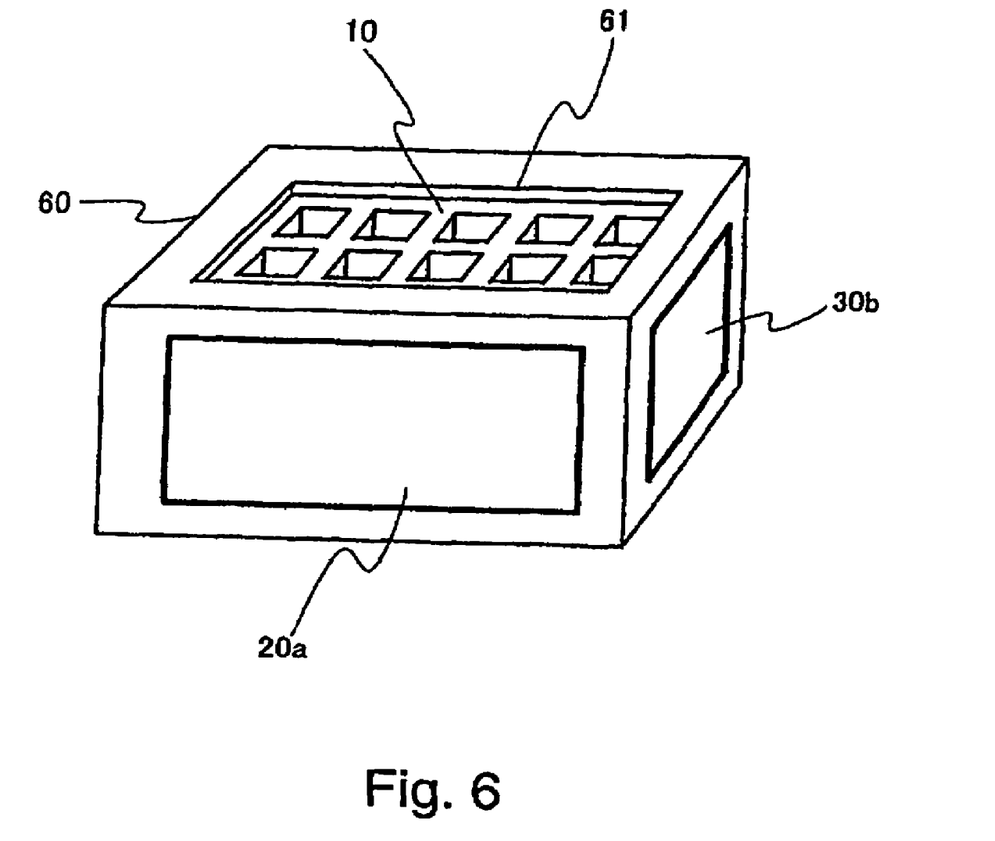
FIG. 6 is a schematic diagram showing one example of a connector holding unit in the wire harness checker according to this embodiment.

FIG. 6 shows one example of the connector holding unit in the wire harness checker according to this embodiment. In FIG. 6, the reference numeral 60 indicates a connector holding unit having a connector receiving portion 61 for receiving therein the connector 10, and positioning and holding the connector 10. The connector holding portion 61 has a space for allowing the connector to be loosely fitted therein, and a bottom formed with an opening portion having an area slightly less than that of a bottom of the connector 10. The Z-axis sensor plates 40a, 40b and the insertion-position designation unit 200 is placed on or attached to the opening portion.

The X-axis sensor plates 20a, 20b and the Y-axis sensor plates 30a, 30b are fixed, respectively, to four side surfaces of the connector holding unit 60 in such a manner that each of the sensor plates is spaced apart from a corresponding one of four side surfaces of the connector received in the connector receiving portion 61, by approximately the same distance.

Thus, an operation for inspecting an attached-state of a terminal-fitted wire during the wire-harness production process can be performed only by fitting the connector 10 into the connector receiving portion 61 of the connector holding unit 60.

Figure 5:
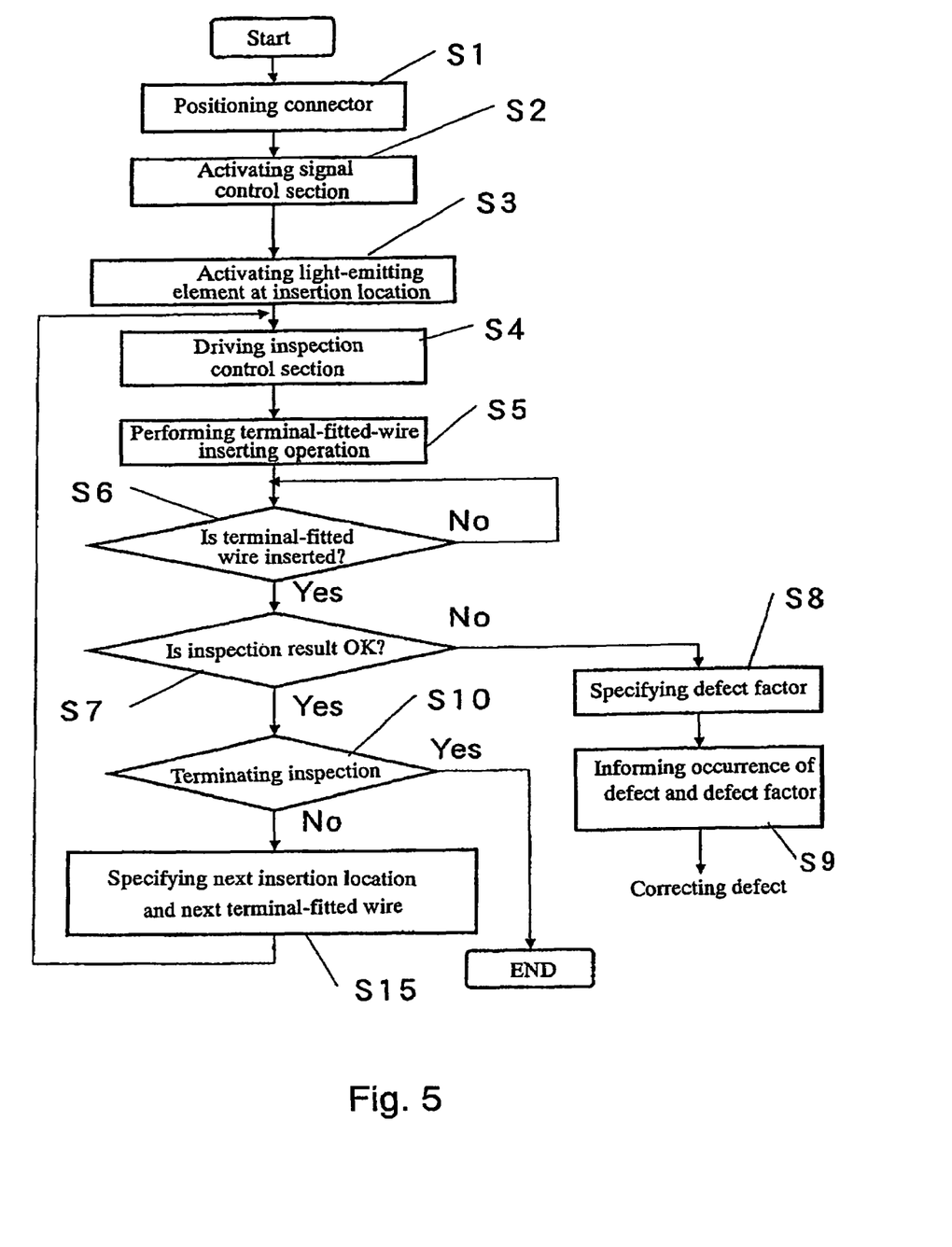
FIG. 5 is a flowchart showing an insertion inspection process using a device for checking an insertion position of a target terminal in a connector, in the wire harness checker according to this embodiment.

FIG. 5 is a flowchart showing an insertion inspection process using a device for checking an insertion position of a target terminal in a connector, in the wire harness checker according to this embodiment.

Referring to FIG. 5, in Step S1, the connector 10 is fitted into the connector receiving portion 61 of the connector holding unit 60 illustrated in FIG. 6, and held by the connector holding unit 60.

In this embodiment, each of the sensor plates (20a, 20b, 30a, 30b, 40a, 40b) are positioned in such a manner as to be located adjacent to a corresponding one of the side surfaces of the connector 10 or adjacent to the bottom surface thereof, when the connector 10 is received in the connector holding unit 60 and held at a position for the terminal-fitted-wire insertion operation. Thus, an after-mentioned inspection operation can be performed only by fitting the connector 10 into the connector holding unit. Thus, after the connector 10 is adequately fitted into the connector holding unit, the process of Step S2 to S15 may be initiated.

After the positioning of the connector, in Step S2, the signal feeding control section 170 is activated. The signal feeding control section 170 starts switchingly feeding an AC inspection signal having a given frequency at given time intervals to each of the signal supply portions, for example, of the watershoot-shaped support members 51 to 54 supporting a plurality of terminal-fitted wires 300 to be inserted into the connector 10. This control will be repeatedly performed until the inspection operation is completed (until all of the terminal-fitted wires are attached to the connector 10). In each of the given time intervals, the AC inspection signal is fed to only either one of the signal supply portions of the watershoot-shaped support members.

In this step, a plurality of indicators may be additionally provided in the watershoot-shaped support members. Specifically, the indicators may be designed such that one of the indicators corresponding to one of the watershoot-shaped support members supporting the terminal-fitted wire to be attached to the connector next is activated to emit light so as to allow this terminal-fitted wire to be visually checked (it is preferably to activate one of the indicators corresponding to one of the watershoot-shaped support members which has the signal supply portion fed with the AC inspecting signal).

An operator can visually check light from the indicator corresponding to one of the watershoot-shaped support members, and unmistakably recognize the terminal-fitted wire to be attached to the connector 10 next.

Then, in Step S3, the insertion-location designation unit 200 is controlled in such a manner that one of the light-emitting elements corresponding to one of the insertion locations into which the target terminal-fitted wire 300 is to be first inserted into the connector is activated to emit light. The operator can check the light through the holes of the Z-axis sensor plates 40*a*, 40*b*, and visually recognize one of the insertion locations into which the terminal-fitted wire extracted from the watershoot-shaped support member, directly without moving his/her visual line.

In addition to the visual recognition of the insertion location in advance, during the insertion operation, the operator can also visually check whether the terminal of the target terminal-fitted wire is inserted into a proper insertion location, because, if the terminal is not inserted into the proper insertion location, the light from the light-emitting element is not blocked.

Then, in Step S4, each of the components of the inspection control section 100 illustrated in FIG. 3 is activated to start the operation for detecting a terminal insertion position (location and depth). Through the aforementioned operation, the peak detection circuits A to F (121 to 126) in the inspection control section 100 start detecting respective peak values of detection signals from the sensor plates.

After confirming that the insertion location is designated in Step S3, the operator starts the terminal-fitted-wire inserting operation in Step S5. Firstly, the operator selects one of the terminal-fitted wires supported by the watershoot-shaped support members 51 to 54, to be inserted into the connector 10 next, and extracts the selected terminal-fitted wire. Then, the operator inserts the terminal of the selected terminal-fitted wire into the designated or desired insertion location, and attaches the selected terminal-fitted wire to the connector.

In response to the inserting/attaching operation, detection signals from the sensor plates can be obtained to detect an insertion location and depth of the terminal in the connector, in accordance with detected peak values of the detection signals.

Then, in Step S6, it is monitored whether the terminal is inserted into the connector 10. Preferably, a completion of attachment of the terminal-fitted wire to the connector 10 is determined whether a given time has lapsed after a detected peak voltage $V_{z1}$ of the Z-axis sensor plate 40*a* exceeds a given value.

Alternatively, the inspection control section 100 may be designed to monitor an output Z from the Z-axis divider circuit 143, and determine the completion of attachment of the terminal-fitted wire when output Z becomes equal to or greater than a given threshold value. Alternatively, the completion of attachment of the terminal-fitted wire may be determined at a time when the terminal is inserted into the connector 10, and the position of the inserted terminal is not changed for a given time-period. That is, the completion of attachment of the terminal-fitted wire may be determined at a time when a detection signal from each of the sensor plates (20*a*, 20*b*, 30*a*, 30*b*, 40*a*, 40*b*) has a given level or more without change for a given time-period. Preferably, the completion of attachment of the terminal-fitted wire is determined by combining two or more of the above techniques.

Then, the process advances to Step S7 for detecting whether the terminal is inserted. In Step S7, the inspection control section 100 detects a location of the terminal of the terminal-fitted wire which is applied with the AC inspection signal and inserted into the connector, to determine whether the terminal is inserted in a proper location.

In this embodiment, the AC inspection signal is sequentially supplied to the terminal-fitted wires, and thereby it can be detected that a specific one of the terminal-fitted wires supported by one of the watershoot-shaped support members 51 to 54 fed with the AC signal is attached to the connector 10. Thus, it can be detected which of the terminal-fitted wires is attached and into which of the insertion locations the terminal of the terminal-fitted wire is inserted, without contact with the terminal-fitted wire and the terminal thereof.

In this embodiment, as to an insertion location of the terminal in the connector, a detection signal value to be obtained when the terminal is inserted into each of the insertion locations of the connector is measured in advance and registered as a reference measured value. Further, a threshold for determining a insertion location is set and registered together with the reference measured value.

Then, during the inspection operation, a measurement/detection result based on the X-axis sensor plates and a measurement/detection result based on the Y-axis sensor plates are compared with the reference measured value to determine an insertion location of the terminal in the connector.

In Step S7, if the designated terminal-fitted wire is not inserted in a designated insertion location of the connector, the process advances to Step S8 for specifying a defect factor.

For example, such a defect is caused when a signal feeding timing in the signal feeding control section 170 corresponds the watershoot-shaped support member supporting the terminal-fitted wire to be attached, but an insertion location of the terminal of this terminal-fitted wire is improper (or when the terminal is erroneously inserted into an improper insertion location), or a signal feeding timing in the signal feeding control section 170 does not correspond the watershoot-shaped support member supporting the terminal-fitted wire to be attached, but an insertion location of the terminal of this terminal-fitted wire is proper (or when a non-designated one of the terminal-fitted wires is erroneously inserted into a proper insertion location).

Then, in Step S9, the fact of occurrence of defect and the defect factor are informed to the operator. The fact of occurrence of defect may be informed by generating a warning sound or by blinking light at the improper insertion location. Further, the defect factor may be indicated on a display panel (not shown), and the improper and proper insertion locations are also indicated thereon.

In response to the error alarm, the operator appropriately corrects the error based on the above information. For example, if an insertion location is improper, the inserted terminal-fitted wire is detached, and another terminal-fitted wire is inserted into the connector 10.

In Step S7, when the terminal of the terminal-fitted wire is inserted in a proper insertion location, and a signal feeding timing in the signal feeding control section 170 corresponds this terminal-fitted wire attached to proper insertion location, the inspection control section 100 determines that the terminal-fitted wire is adequately attached, and the process advances to Step S10 for determining whether all of the terminal-fitted wires are attached to the connector 10. When it is determined that all of the terminal-fitted wires are attached to the connector 10, this fact is informed, for example, using a completion sound, and the operator terminates the operation for inserting the terminal into the connector.

In Step S10, when it is determined that all of the terminal-fitted wires are not attached to the connector 10, the process advances to Step S15 for specifying the watershoot-shaped support member supporting the terminal-fitted wire to be attached next, and the insertion location of the connector to which this terminal-fitted wire is attached. After specifying the watershoot-shaped support member and the insertion location, the process advances to Step S3.

As mentioned above in detail, the wire harness checker according to this embodiment makes it possible to inspect whether a terminal of a terminal-fitted wire is properly inserted in a connector, only by arranging sensor plates at respective positions opposed to and adjacent to corresponding surfaces of an outer wall of a connector, without contact with the terminal-fitted wire having a great impact on reliability of a wire harness product, so as to allow a wire harness to be produced with high efficiency.

The wire harness checker can also reliably suppress occurrence of defective products without adding a particular inspection stage in a wire harness production process. In addition, the wire harness checker makes it possible to inspect a wire harness by feeding/supplying an AC inspection signal with a low level free of adverse affect on human body.

The wire harness checker can supply the inspection signal from any portion of a terminal-fitted wire to be attached to a connector, without contact with an electrically conductive material. This makes it possible to supply the inspection signal various terminal-fitted wires different in length, in the same manner.

The wire harness checker has no need for arranging a probe at a bottom of a connector to supply the inspection signal to a terminal-fitted wire. This makes it possible to position means for designating an insertion location (insertion-position designating light-emitting elements), at the bottom, and optionally form a hole in the bottom to allow light from the designation means to be visually checked from above the connector, so as to directly designate an insertion location of the terminal-fitted wire to ensure a reliable insertion operation. Further, in the event of error in insertion location, this fact can be recognized directly and visually to prevent occurrence of defective products.

The wire harness checker makes it possible to substantially eliminate adverse affects caused by variations in the AC inspection signal to be supplied to the terminal during measurement on a position of the terminal in a connector. Thus, the wire harness checker can have high reliability.

INDUSTRIAL APPLICABILITY

As above, the present invention can provide a wire harness checker and a wire harness checking method capable of determining the presence of defect in attachment of a terminal-fitted wire during a wire harness production process while eliminating the need for adding a particular inspection stage, without contact with the terminal-fitted wire and without damages in a terminal of the terminal-fitted wire to be inserted in a connector.

What is claimed is:

1. A wire harness checker for inspecting a state when and after a terminal of a terminal-fitted wire having an end fixedly fitted with said terminal is inserted into a connector housing to form a wire harness, comprising:

AC inspection signal supply means for supplying an AC inspection signal to said terminal-fitted wire at least when said terminal thereof is inserted in said connector housing;

at least one pair of electrically-conductive plates disposed adjacent to said connector housing and adapted to detect the AC inspection signal from said terminal of said terminal-fitted wire inserted into said connector housing; and determination means for determining a position where said terminal of said terminal-fitted wire supplied with the AC detection signal from said AC inspection signal supply means is inserted in said connector housing, in accordance with a relative detection value of each detection signal of said pair of electrically-conductive plates.

2. The wire harness checker as defined in claim 1, wherein said determination means is operable to convert each detection signal of said pair of electrically-conductive plates into said relative detection value, on the basis of a distance between said electrically-conductive plates, so as to cancel a variation in the AC inspection signal supplied to said terminal-fitted wire.

3. A wire harness checking method for use in a wire harness checker which includes: a plurality of wire support members each adapted to support, with respect to each of a plurality of insertion locations of said connector housing, a corresponding one of a plurality of terminal-fitted wires to be sequentially attached to a connector housing, and provided with a signal supply portion adapted to achieve capacitive coupling for each of said terminal-fitted wires; inspection signal feeding means for feeding an AC inspection signal to one of said wire support members which supports one of said terminal-fitted wires to be attached to said connector housing, so as to supply the AC inspection signal to said terminal-fitted wire; and at least one pair of electrically-conductive plates disposed adjacent to an outer surface of said connector housing in opposed relation to one another, comprising:

detecting each of the AC inspection signals from said electrically-conductive plates;

determining a location where one of said terminal-fitted wires is attached to said connector housing, in accordance with a relative detection value of each of said detected AC inspection signals; and allowing checking on whether one of said terminal-fitted wires supplied with the AC inspection signals corresponds to said determined location of said attached terminal-fitted wire.

4. An apparatus for inspecting a position where a terminal supplied with an AC inspection signal is inserted in a connector housing, comprising:

at least one pair of electrically-conductive plates disposed adjacent to an outer surface of said connector housing in opposed relation to one another and adapted to detect the AC inspection signal from said terminal inserted into said connector housing; and determination means for determining an insertion position of said terminal in said connector housing, in accordance with an AC-inspection-signal detection result from each of said electrically-conductive plates, said determination means being operable to determine an insertion position of said terminal in said connector housing, in accordance with a relative detection value of each detection signal of said pair of electrically-conductive plates, so as to inspect said insertion position of said terminal in said connector housing.

5. The apparatus as defined in claim 4, wherein, given that said pair of electrically-conductive plates are defined, respectively, as n1 and n2, said determination means is operable to determine an insertion position of said terminal in said connector housing by comparing between a value obtained from the following formula: (Vn2)/(Vn1+Vn2), wherein Vn1 and Vn2 are, respectively, signal values detected from said terminal by said pair of electrically-conductive plates, and a reference value obtained from the following formula: (Vn2)/(Vn1+Vn2), wherein Vn1 and Vn2 are, respectively, signal values detected by said pair of electrically-conductive plates when disposed at a predetermined reference position, so as to inspect said insertion position of said terminal in said connector housing.

* * * * *